(12) United States Patent
Stewart

(10) Patent No.: US 10,716,217 B2
(45) Date of Patent: Jul. 14, 2020

(54) POLY-BASED BURR SUPPRESSOR

(71) Applicant: Matrix Electronics Limited, Mississauga (CA)

(72) Inventor: Shane Hugh Stewart, Belfountain (CA)

(73) Assignee: Advanced Copper Foil Inc., Mississauga, ON (CA)

( * ) Notice: Subject to any disclaimer, the term of this patent is extended or adjusted under 35 U.S.C. 154(b) by 399 days.

(21) Appl. No.: 15/266,267

(22) Filed: Sep. 15, 2016

(65) Prior Publication Data

US 2018/0077804 A1 Mar. 15, 2018

(51) Int. Cl.
| | |
|---|---|
| H05K 3/00 | (2006.01) |
| B32B 15/00 | (2006.01) |
| H05K 3/02 | (2006.01) |
| B32B 15/14 | (2006.01) |
| H05K 3/46 | (2006.01) |

(52) U.S. Cl.
CPC ............. *H05K 3/0047* (2013.01); *H05K 3/02* (2013.01); *B32B 15/14* (2013.01); *H05K 3/007* (2013.01); *H05K 3/46* (2013.01); *Y10T 156/1057* (2015.01)

(58) Field of Classification Search
CPC ................................................ Y10T 156/1057
See application file for complete search history.

(56) References Cited

U.S. PATENT DOCUMENTS

| | | | | |
|---|---|---|---|---|
| 3,532,801 | A * | 10/1970 | Faulkner | H05K 3/0088 174/266 |
| 4,781,495 | A * | 11/1988 | Hatch | H05K 3/0047 264/155 |
| 2013/0213696 | A1* | 8/2013 | Yamamoto | H05K 3/386 174/254 |

FOREIGN PATENT DOCUMENTS

WO    WO-2016010083 A1 *  1/2016   ............. H01L 23/12

OTHER PUBLICATIONS

English translation of description of WO-2016010083 Kato 42 pages (Year: 2016).*

* cited by examiner

*Primary Examiner* — Linda L Gray
(74) *Attorney, Agent, or Firm* — Rowand LLP

(57) ABSTRACT

A burr-suppressing copper foils are described. In an embodiment, the burr suppressing copper foil includes a poly-based film having an adhesive on a first side and an adhesive on a second side. A copper foil contacts the adhesive at the first side of the poly-based film to removably couple the poly-based film to the copper foil. A metallic burr suppressor contacts the adhesive on the second side to removably couple the poly-based film to the metallic burr suppressor.

15 Claims, 4 Drawing Sheets

POLY-BASED BURR SUPPRESSOR

TECHNICAL FIELD

The present application relates to circuit boards and, more particularly, to materials and methods for suppressing burrs during manufacture of circuit boards.

BACKGROUND

During printed circuit board (PCB) manufacture, holes are typically drilled into the PCB. These holes may be used for the insertion of through-hole-component leads or may be used as "vias" to connect board layers.

The PCB has an exposed copper surface. Since copper is a very soft metal, the copper tends to burr if it is drilled without adequate support. Current methods of avoiding or suppressing burrs during the PCB drilling process involve stacking the PCB on a backup material, typically constructed of Melamine or hard-coated high-density fiberboard (HDF). The top side of the PCB is covered with an aluminum entry, which is often a sheet of aluminum approximately 150 microns to 250 microns in thickness. This technique has many drawbacks. For example, in some instances, while an operator is placing the PCB on the backup material or placing the aluminum entry material on top of the PCB, debris may become trapped between the PCB and either the backup material or the aluminum entry material. This debris may create a gap between the PCB and the backup material or aluminum entry material and the gap may allow a burr to be formed.

Gaps between the PCB and the backup material or the aluminum entry material may also exist if the PCB is not perfectly flat. For example, a warped PCB may create such gaps, allowing burrs to form during drilling.

In some instances, burrs may be pushed back into their associated hole so that the burr height of the burr (i.e., the amount by which the burr extends over the PCB) is reduced or eliminated. However, pushing the burr back into the hole can result in an undersized hole. This can cause a PCB to be rejected, resulting in scrapping of the PCB.

Furthermore, the back-up material that is commonly used for burr suppression is a coated wood core back-up material which is relatively expensive.

Thus, there is a need for improved methods and materials for suppressing burrs during PCB manufacture.

BRIEF DESCRIPTION OF THE DRAWINGS

Reference will now be made, by way of example, to the accompanying drawings which show embodiments of the present application, and in which.

Like reference numerals are used in the drawings to denote like elements and features.

DETAILED DESCRIPTION OF EXAMPLE EMBODIMENTS

As will be described in greater detail below, in some embodiments a burr-suppressing copper foil is described. In an embodiment, the burr suppressing copper foil includes a poly-based film having an adhesive on a first side and an adhesive on a second side. A copper foil contacts the adhesive at the first side of the poly-based film to removably couple the poly-based film to the copper foil. A metallic burr suppressor contacts the adhesive on the second side to removably couple the poly-based film to the metallic burr suppressor.

In another aspect, a method of manufacturing a burr-suppressing copper foil is described. The method comprises: providing a copper foil, a metallic burr suppressor, and a poly-based film, the poly-based film having an adhesive applied to opposing sides of the poly-based film; attaching the copper foil to the poly-based film at a first side of the poly-based film using the adhesive; and attaching the metallic burr suppressor at a second side of the poly-based film using the adhesive.

In yet another aspect, a method for manufacturing a printed circuit board (PCB) is described. The method includes: constructing a book having a burr-suppressing copper foil on at least one exterior sides of the book, the burr-suppressing copper foil comprising a poly-based film having an adhesive applied at opposing sides, a copper foil coupled to the poly-based film on a first side of the poly-based film and a metallic burr suppressor coupled to the poly-based film on a second side of the poly-based film, the metallic burr suppressor being an outer layer of the book; applying a lamination cycle to the book using a laminating press to cure the book; and after the lamination cycle, drilling the laminated book.

Figure 1:
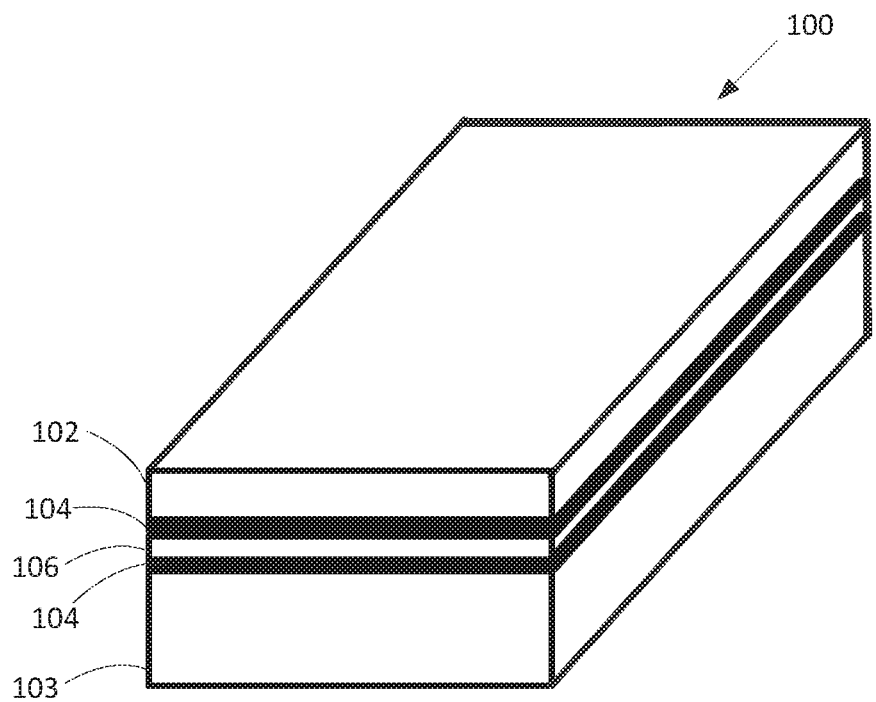
FIG. 1 is a perspective view of a burr suppressing copper foil.
Figure 2:
FIG. 2 is a side view of the burr suppressing copper foil of FIG. 1.

Reference will first be made to FIGS. 1 and 2 which illustrate an example burr-suppressing copper foil 100. FIG. 1 illustrates a perspective view of the burr-suppressing copper foil 100 while FIG. 2 illustrates a side view of the burr-suppressing copper foil 100.

The burr-suppressing copper foil 100 includes a copper foil 102. The copper foil 102 may have a thickness in the range of 9 to 70 microns. In some embodiments, the copper foil may be thinner, having a thickness that is less than 9 microns.

In order to provide burr-suppressing features to the copper foil 102 which will help prevent burrs during drilling, the copper foil 102 may be removably attached to a metallic burr suppressor 103 with an adhesive 104.

For example, in the example illustrated, the copper foil 102 is removably attached to the metallic burr suppressor 103 with a poly-based film 106. The poly-based film 106 has an adhesive 104 applied at both sides so that side of the poly-based film 106 has sticky surfaces. This allows the poly-based film 106 to stick to both the copper foil 102 and the metallic burr suppressor 103 when the adhesive of the poly-based film is brought into contact with the copper foil 102 and the metallic burr suppressor 103.

Accordingly, an adhesive 104 is provided between the poly-based film 106 and the copper foil 102 and also between the poly-based film 106 and the metallic burr suppressor 103. The adhesive 104 is permanently attached to the poly-based film and is removably attached to the copper foil 102. Thus, when the poly-based film 106 is detached from the copper foil 102, the adhesive remains on the poly-based film 106 and not the copper foil 102.

The adhesive 104 that is applied to the poly-based film 106 may also removably attach the metallic burr suppressor 103 to the poly-based film 106 to facilitate recycling of the metallic burr suppressor 103. For example, after drilling of a PCB, the poly-based film 106 may be removed from the PCB by detaching the poly-based film 106 from the copper foil 102 (which forms an outer layer of the PCB). The poly-based film 106 may also be detached from the metallic burr suppressor 103 so that the metallic burr suppressor 103 can be recycled.

The metallic burr suppressor 103 and the copper foil 102 are coupled to the poly-based film at opposing sides of the poly-based film such that the poly-based film 106 is sandwiched between the metallic burr suppressor 103 and the copper foil 102. For example, the copper foil 102 may be attached at a first side and the metallic burr suppressor 103 may be attached at a second side which is opposite the first side.

The metallic burr suppressor 103 is a non-ferrous metal. For example, in one embodiment, the metallic burr suppressor 103 is a copper layer, such as a copper panel. In another embodiment, the metallic burr suppressor 103 is an aluminum layer such as an aluminum panel. In some embodiments, different versions of the burr-suppressing copper foil may be constructed for suppressing burrs in different environments. For example, in some embodiments, an aluminum version (i.e., a version in which the metallic burr suppressor is aluminum) may be used for suppressing a burr at an entry side of a drill while a copper version (i.e., a version in which the metallic burr suppressor is copper) may be used for suppressing a burr at an exit side of a drill. The entry side is the side of the PCB at which the drill first enters the PCB and the exit side is the side at which the drill exits the PCB. In one embodiment of the aluminum version of the burr-suppressing copper foil, the aluminum metallic burr suppressor is between 150 to 250 microns thick. In one embodiment of the copper version of the burr-suppressing copper foil, the copper metallic burr suppressor is between 17 and 70 microns thick.

Turning now to a discussion of the copper foil 102, the copper foil is the portion of the burr-suppressing copper foil 100 which will be used in a PCB. The poly-based film and the metallic burr suppressor 103 are removed from the PCB after drilling, but the copper foil 102 itself will remain as an outer layer of the PCB.

Since the poly-based film 106 and the metallic burr suppressor 103 are only removed after drilling, they will typically remain attached to the copper foil 102 during a lamination process in which the copper foil 102 is laminated to other layers of a PCB. During this lamination process, the burr-suppressing copper foil 100 may be subjected to temperatures in excess of 180 degrees Celsius or greater in order to cure prepreg and laminate the PCB. The specific temperatures that are required will depend on the nature of the prepreg used, but in some instances the temperatures may even exceed 200 degrees Celsius.

Notably, many poly-based films cannot be heated to such temperatures and would deteriorate under such conditions. Due to the sensitive nature of PCB manufacturing any deterioration that could leave residue on the PCB after manufacture could result in adverse effects, such as a non-functioning PCB.

The poly-based film 106 may be a polyethylene terephthalate (PET) film. Notably, while many poly-based films operate poorly in high-temperature environments, the PET film operates well in such environments. The PET film does not deteriorate under a heating temperature of one 180 degrees Celsius and does not deteriorate at heating temperatures of 200 degrees Celsius.

In some embodiments, the poly-based film 106 may be an Ethylene tetrafluoroethylene (ETFE) film. ETFE film also has a high temperature resistance and has been found to perform well in the temperature range of intended applications.

The thickness of the poly-based film 106 may vary but in some embodiments, the poly-based film 106 has a thickness of between 45 and 100 microns.

Since the poly-based film 106 remains attached to the copper foil 102 throughout much of the manufacturing process of the PCB, the poly-based film 106 (and the metallic burr suppressor 103) acts as a protector, protecting the copper foil 102 from damage, dirt and debris. Accordingly, the poly-based film 106 may be referred to as a protective film.

The adhesive 104 used to removably couple the poly-based film 106 to the copper foil 102 is a low-tack adhesive that allows the copper foil 102 to be easily removed from the poly-based film 106 and the adhesive 104 (i.e., it can be removed by a human without mechanical assistance). For example, the adhesive may have a tack/adhesion strength less than or equal to 6 grams per 25 millimeter width. In some embodiments, the tack/adhesion strength is between 3 to 6 grams per 25 millimeter width.

The tack strengths referred to above refer to the tack strength that the adhesive has with the copper foil 102 (and the metallic burr suppressor 103). The adhesive 104 adheres to the poly-based film 106 with a much greater force. For example, the adhesive may be permanently applied to the poly-based film 106. Thus, when the poly-based film 106 is separated from the copper foil 102 and the metallic burr suppressor 103, the adhesive 104 remains on the poly-based film 106 and not the copper foil 102 or the metallic burr suppressor 103.

In some embodiments, the adhesive 104 used to attach the poly-based film 106 to the metallic burr suppressor 103 may be the same as the adhesive used to attach the poly-based film 106 to the copper foil 102. In other embodiments, however, these adhesives may be different to facilitate separation. For example, in one embodiment, the adhesive may be configured or selected so that the tack strength between the metallic burr suppressor 103 and the poly-based film 106 is greater than the tack strength between the copper foil 102 and the poly-based film 106. In this way, the poly-based film 106 and the metallic burr suppressor 103 may be easily removed from the copper foil as a single unit and then the poly-based film 106 can subsequently be detached from the metallic burr suppressor 103.

In at least some embodiments, the adhesive 104 is a non-silicone based adhesive. Since silicone is a semi-conductor, the use of a silicone adhesive can cause defects in PCBs if any silicone residue is left on the copper foil 102 when the poly-based film 106 is detached from the copper foil 102.

The adhesive 104 may be an acrylic adhesive. Acrylic adhesives have good temperature performance. That is, the acrylic adhesive 104 does not degrade under the high temperatures that some applications of the product require. For example, the acrylic adhesive, in at least some embodiments, does not degrade at a temperature of 180 degrees Celsius. In at least some embodiments, the acrylic adhesive does not degrade at a temperature of 200 degrees Celsius. "Degrade", as used herein with respect to the adhesive, means to break down in quality or consistency so as to leave behind adhesive residue on the copper foil when the copper foil and the poly-based film are detached from one another. That is, the adhesive is considered not to have degraded if it continues to remove well from the copper foil.

The adhesive 104 is uniform across a surface of the poly-based film 106 that contacts the copper foil 102. That is, the adhesive 104 resides at all locations between the poly-based film 106 and the copper foil 102 and is applied at approximately the same coat weight irrespective of its location on the surfaces. For example, in at least some embodiments, the adhesive may be approximately 25 to 50 microns in thickness. The thickness of the adhesive may be the same across the entire surface of the poly-based film 106 that contacts the copper foil 102. Applying the adhesive across the entire surfaces of the copper foil 102 and the poly-based film 106 aids in preventing the poly-based film from detaching from the copper foil 102 during drilling.

The adhesive 104 is also uniform across a surface of the poly-based film 106 that contacts the metallic burr suppressor 103. That is, the adhesive 104 resides at all locations between the poly-based film 106 and the metallic burr suppressor 103 and is applied at approximately the same coat weight irrespective of its location on the surfaces. For example, in at least some embodiments, the adhesive may be approximately 25 to 50 microns in thickness. The thickness of the adhesive may be the same across the entire surface of the poly-based film 106 that contacts the metallic burr suppressor 103. Applying the adhesive across the entire surfaces of the copper foil 102 and the poly-based film 106 aids in preventing the poly-based film from detaching from the copper foil 102 during drilling.

Figure 3:
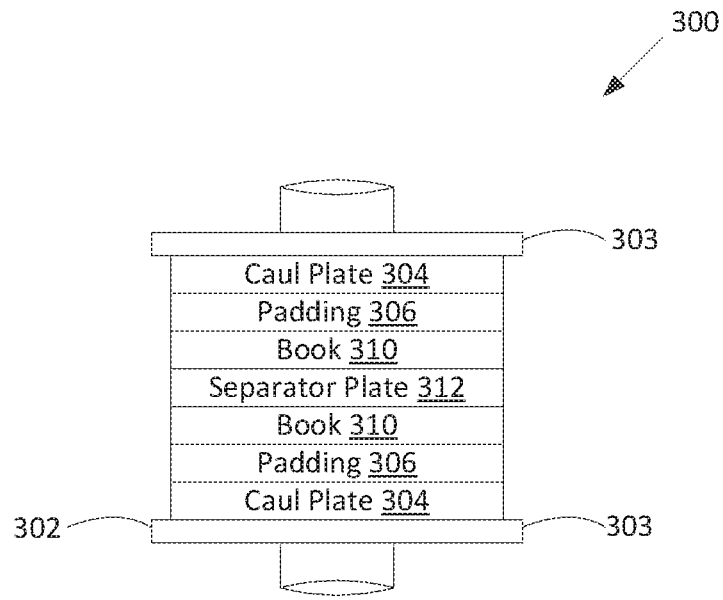
FIG. 3 is a side view of an example lamination press arrangement.

Reference will now be made to FIG. 3, which illustrates an example lamination press arrangement 300 for one application of the burr-suppressing copper foil 100 of FIGS. 1 and 2.

The lamination press arrangement 300 of FIG. 3 includes a lamination press 302 used to manufacture a PCB. More particularly, in the example the lamination press 302 is used to manufacture a multi-layer PCB. The lamination press 302 is a specialized hydraulic press with heated platens 303. The heated platens 303 are used to cure prepreg. A prepreg (or pre-impregnated layer) is fiberglass that is impregnated with a resin (i.e., a thermosetting epoxy). The resin is dried but not hardened such that it flows when heated, by the lamination press 302, to a curing temperature.

The lamination press is configured to apply heat and pressure to layers which form the PCB to bond them together.

The lamination press 302 includes caul plates 304. The caul plates 304 include both an upper and a lower caul plate. The caul plates 304 (which may also be referred to as carrier plates or tooling plates) rest in the lamination press 302. More particularly, the caul plates 304 are adjacent the heated platens 303.

In at least some embodiments, padding 306 may be inserted between the caul plates 304 and the layers that will form the PCB. That is, there may be upper and lower padding 306, bounding the layers that will form the PCB. This padding 306 is used to control the rate of heat transfer between the heated platens 303 and the layers that will form the PCB. Further, the padding 306 can be used to compensate for imperfections such as non-parallel, bowed or warped platens, imperfections in the caul plates, etc. In some embodiments, the padding 306 may include several plies of thick Kraft paper. In some embodiments, the padding 306 may include press pad.

One or more books 310 are provided between the caul plates 304 and between the padding 306. In the example of FIG. 3, two books 310 are illustrated. However, a greater or lesser number of books may be inserted within the lamination press at any given time. For example, in some embodiments, only a single book is included. In other embodiments, a greater number of books are included. By way of example, in one embodiment, six books may be included in the lamination press at a given time.

The books 310 may be separated from one another by a separator plate 312. The separator plate 312 is a hard metal plate, such as stainless steel (in which case the separator plate may be referred to as a stainless steel separator plate).

Figure 4:
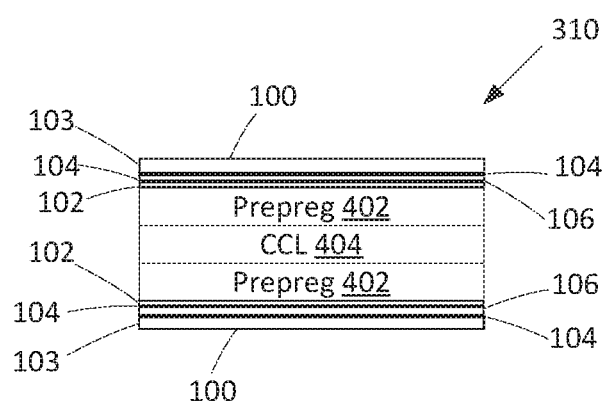
FIG. 4 is a side view of an example book for use in the lamination press arrangement of FIG. 3.

Reference will now be made to FIG. 4 which illustrates an example book 310. The example book 310 includes two burr-suppressing copper foils 100. The burr-suppressing copper foils 100 are of the type described above with reference to FIGS. 1 and 2. A first one of the burr-suppressing copper foils 100 is located at the bottom of the book 310 and a second one of the burr-suppressing copper foils 100 is located at the top of the book 310. The metallic burr suppressors 103 of the burr-suppressing copper foils 100 are outward facing. That is, the metallic burr suppressors are the outside layer of the book 310. Notably, the poly-based films 106 helps to provide some padding, much like the padding 306 discussed above. The padding provided by the poly-based films 106 can help reduce the transmission of imperfections from the separator plates 312 or the caul plates 304 to the copper foil 102.

In at least some embodiments, the book 310 may include a different version of the burr-suppressing copper foil 100 on the top side than on the bottom side of the book 310. For example, in one embodiment, an aluminum version of the burr-suppressing copper foil 100, in which the metallic burr suppressor is an aluminum layer, is located on the top side, while a copper version of the burr-suppressing copper foil 100, in which the metallic burr suppressor is a copper layer, is located on the bottom side. Thus, one end on the book is a drill-entry end, which has the aluminum version of the burr-suppressing copper foil 100 while the other end of the book is a drill-exiting end, which has the copper version of the burr-suppressing copper foil 100.

The copper foils 102 of the burr-suppressing copper foils 100 are adjacent to and in contact with prepreg 402. For example, a first prepreg 402 is adjacent the copper foil 102 associated with the bottom one of the burr-suppressing copper foils 100 and a second prepreg 402 is adjacent the copper foil 102 associated with the top one of the burr-suppressing copper foils 100.

Between the first and second prepreg is one or more copper clad laminates (CCL) 404. That is, a first prepreg may be adjacent the copper foil of a first burr-suppressing copper foil 100 and also adjacent the CCL 404 and a second prepreg may be located at a side of the CCL that opposes the side adjacent the first prepreg.

The copper clad laminate (CCL) may be a two-sided CCL 404. In the example, only a single CCL 404 is included to form a four-layer PCB. However, in practice there may be a greater number of CCLs included. Each CCL layer is separated from adjacent CCL layers with prepreg.

Figure 5:
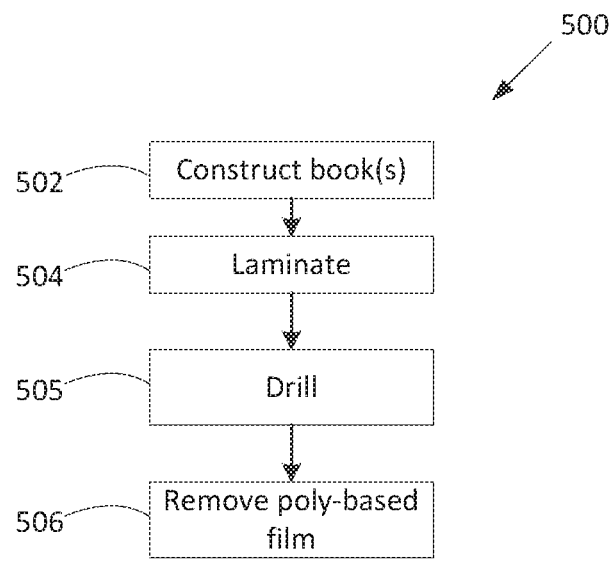
FIG. 5 is a flowchart of an example method of manufacturing a printed circuit board.

Referring now to FIG. 5, a method 500 of manufacturing a PCB will be described. The method 500 makes use of a burr-suppressing copper foil 100 of the type described above with reference to FIGS. 1 to 2 and a lamination press 302 of the type described above with reference to FIG. 3.

The method includes, at operation 502, constructing one or more books 310 of the type described above with reference to FIG. 4. The books are generally constructed in a bottom-up fashion, beginning at the lowest layer in the stack-up and proceeding to the top layer. By way of example, a first book 310 may constructed by stacking a bottom burr-suppressing copper foil 100 with the metallic burr suppressor 103 downwardly facing and the copper foil 102 upwardly facing and then adding a layer of prepreg 402 on top of the copper foil 102. The bottom burr-suppressing copper foil 100 may be the copper version of the burr-suppressing copper foil.

A CCL 404 may then be added to the prepreg 402 and additional CCLs may be added, if desired, along with respective prepreg layers. Then, prepreg 402 is stacked on top of the uppermost CCL 404 and another burr-suppressing copper foil 100 is added to that prepreg 402. This upper burr-suppressing copper foil 100 is oriented so that the copper foil 102 faces downward and is in contact with the prepreg 402 and so that the metallic burr suppressor 103 faces upward. The upper burr-suppressing copper foil 100 may be the aluminum version of the burr-suppressing copper foil.

Accordingly, a book is constructed in 502 which has a burr-suppressing copper foil on at least one exterior side of the book and, in some embodiments, on both exterior sides. The burr-suppressing copper foil 100 is as described above with reference to FIGS. 1 and 2. For example, the burr-suppressing copper foil 100 includes a poly-based film having an adhesive applied at opposing sides, a copper foil coupled to the poly-based film on a first side of the poly-based film and a metallic burr suppressor coupled to the poly-based film on a second side of the poly-based film. The metallic burr suppressor is, therefore, an outer layer of the book.

If multiple books are to be included in one lamination cycle, a separator plate 312 may be applied on a first side of the constructed book. More particularly, the separator plate 312 may be applied on top of the upper metallic burr suppressor 103 so that a further book may be stacked on top. This process may be repeated until the desired number of books are constructed.

At operation 504, a lamination cycle is applied to the book(s) using a lamination press 302 of the type described above with reference to FIG. 3 to cure the prepreg 402. The lamination is performed using specific predetermined operating characteristics, include specific times, temperatures and pressures. These characteristics depend, at least in part, on the prepreg that is used. The lamination cycle may heat the book(s) to at least 180 degrees Celsius, in some embodiments. In some embodiments, the lamination cycle may heat the book(s) to at least 200 degrees Celsius. The lamination cycle may, in some embodiments, take between 60 and 100 minutes. However, other lamination cycles may be used in other embodiments.

After the lamination cycle, de-booking occurs. In some embodiments, the book(s) may be subjected to a cooling cycle prior to de-booking. For example, cold water may be run over the book(s) to quickly cool them and an operator can then de-book.

At operation 505, the laminated book is drilled. In at least some embodiments in which the book includes different versions of the burr-suppressing copper foil 100 at an upper end of the book than at a lower end of the book, the drilling occurs so that the drill enters an aluminum version of the burr-suppressing copper foil 100 and exits a copper version of the burr-suppressing copper foil 100. For example, an aluminum panel may form an entry side of the book for a drill bit while a copper panel may form an exist side of the book for the drill bit.

Figure 6:
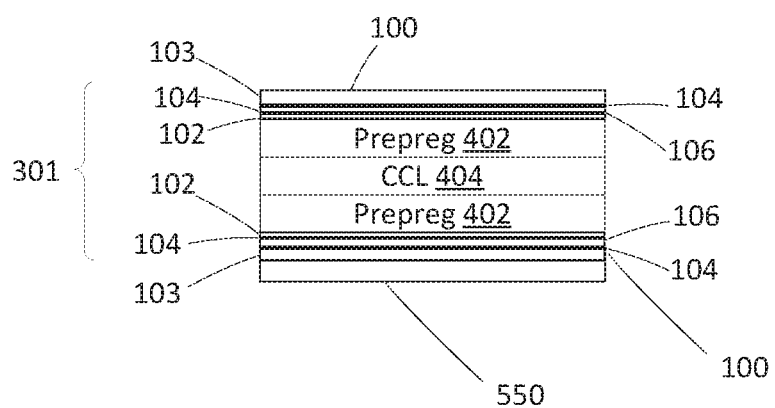
FIG. 6 is a side view of an example book on an uncoated wood core material.

Referring briefly to FIG. 6, in at least some embodiments, prior to drilling, the laminated book 310 is placed on an uncoated wood core material 550, such as Tek-Board (i.e., such that the bottom burr-suppressing copper foil 100 contacts the uncoated wood core material). Such materials are cheaper than the coated word core material that is used during traditional drilling processes.

Referring again to FIG. 5, at operation 506, the poly-based films 106 are removed from the book(s). That is, the poly-based films 106 are removed from respective copper foils. Notably, when this occurs, there is no banding of the adhesive; the acrylic adhesive removes cleanly and does not remain on the copper foil 102 after removal of the poly-based film 106.

After the poly-based film is removed to expose the copper foil 102, the copper foil 102 may be etched.

The poly-based films may also be detached from the metallic burr suppressors so that the metallic burr suppressors may be recycled.

Figure 7:
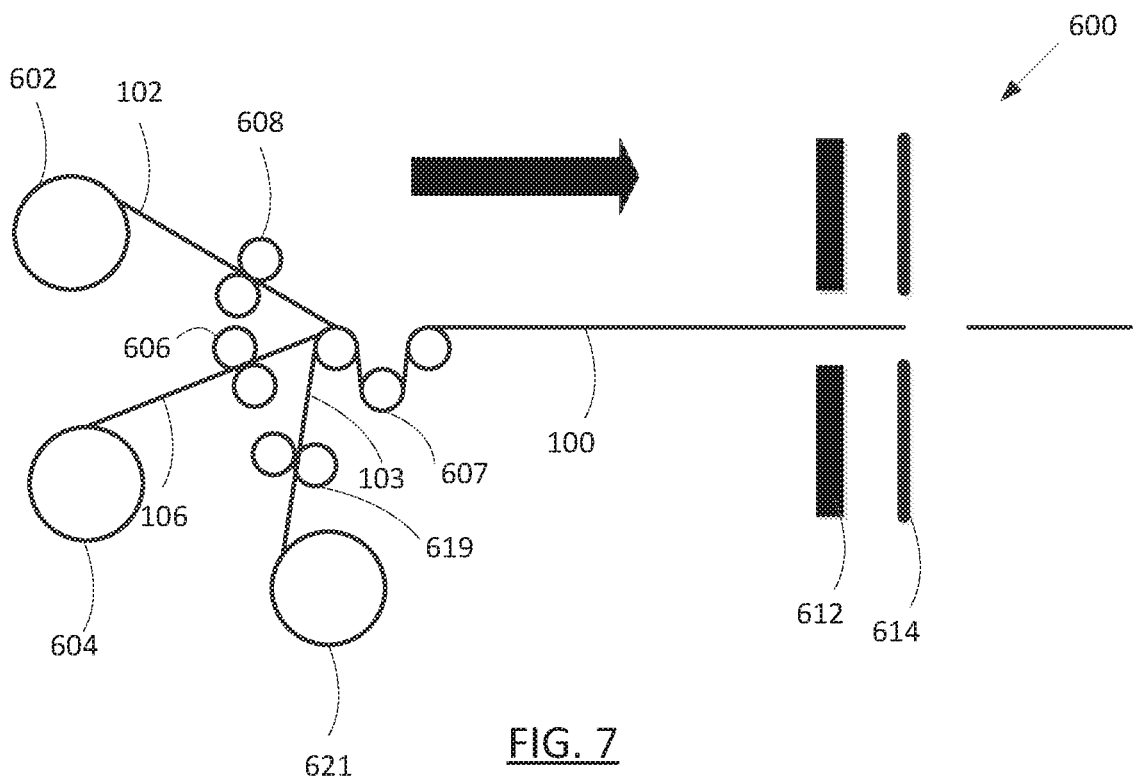
FIG. 7 is a block diagram of an example machine for manufacturing a burr suppressing copper foil.

Techniques for manufacturing the burr-suppressing copper foil 100 described above will now be discussed. Reference will first be made to FIG. 7, which illustrates, in block form, a sample machine 600 for manufacturing a burr-suppressing copper foil 100. The machine 600 may be located in a clean room environment, in some embodiments.

The machine includes a first material handling unit 602. The first material handling unit 602 receives the copper foil 102 of the type described herein with reference to FIGS. 1 and 2. The copper foil 102 may be received in roll form. In at least some embodiments, the material handling unit allows the roll to rotate.

The machine 600 also includes a second material handling unit. 604. The second material handling unit 604 is for receiving a poly-based film 106 of the type described above with reference to FIGS. 1 and 2. In at least some embodiments, the poly-based film 106 has an adhesive applied to both surfaces of the poly-based film 106. That is, a first side and a second side of the poly-based film may both have an adhesive 104 of the type described herein applied thereon. In at least some embodiments, a liner, such as a mylar liner, may act as a backing to the adhesive and the second material handling unit 604 may be configured to remove the liner. The poly-based film may be received in roll form. In at least some embodiments, the material handling unit allows the roll to rotate.

The machine 600 also includes a third material handling unit 621. The third material handling unit 621 is for receiving a metallic burr suppressor 103 of the type described herein with reference to FIGS. 1 and 2. The metallic burr suppressor 103 may be received in roll form. In at least some embodiments, the material handling unit 621 allows the roll to rotate.

At least one roller 607 (or other material gripper) is provided in the machine, and, at least one of the rollers (or another material gripper) is coupled with a drive. The drive rotates the roller 607 (or otherwise drives the material gripper) causing the roller 607 to pull the copper foil and the metallic burr suppressor into contact with the poly-based film and to attach the copper foil and the metallic burr suppressor to the poly-based film using the adhesive applied to the surfaces of the poly-based film.

The at least one roller 607 may be configured to remove any air bubbles between the poly-based film 106 and the copper foil 102 and between the poly-based film 106 and the metallic burr suppressor 103 and may, in at least some embodiments, be configured to apply a force to the poly-based film 106 to hold the poly-based film taut during the attaching.

The machine 600 may also include a cleaner 606 for cleaning the poly-based film prior to the attaching. The cleaner 606 may include one or more adhesive take-up rollers which have a tack for removing debris. In some embodiments, the adhesive take-up rollers may include silicone rollers.

The machine 600 may also include a cleaner 608 for cleaning the copper foil 102 prior to the attaching. Such cleaners 608 may include one or more adhesive take-up rollers which have a tack for removing debris. In some embodiments, the adhesive take-up rollers may include silicone rollers.

The machine 600 may also include a cleaner 619 for cleaning the metallic burr suppressor 103 prior to the attaching. Such cleaners 608 may include one or more adhesive take-up rollers which have a tack for removing debris. In some embodiments, the adhesive take-up rollers may include silicone rollers.

The machine 600 may also include a punching station 612 which adds tooling holes for receipt in the lamination press 302. The punching station is located so that holes are applied after the copper foil and the metallic burr suppressor have been attached to the poly-based film.

The machine 600 may also include a shearing station 614. The shearing station 614 cuts the burr-suppressing copper foil 100 into panels that fit within the lamination press 302. For example, in one embodiment, the burr-suppressing copper foil 100 is cut into 18"×24" panels.

In some embodiments, the machine 600 may not include the shearing station 614 and/or the punching station. If desired, such panelizing and tooling operations could be done offline. That is, the machine 600 may manufacture a roll of burr-suppressing copper foil 100 and, if desired for a particular application, the roll could be post-processed to include tooling features and to cut the roll into smaller portions.

Figure 8:
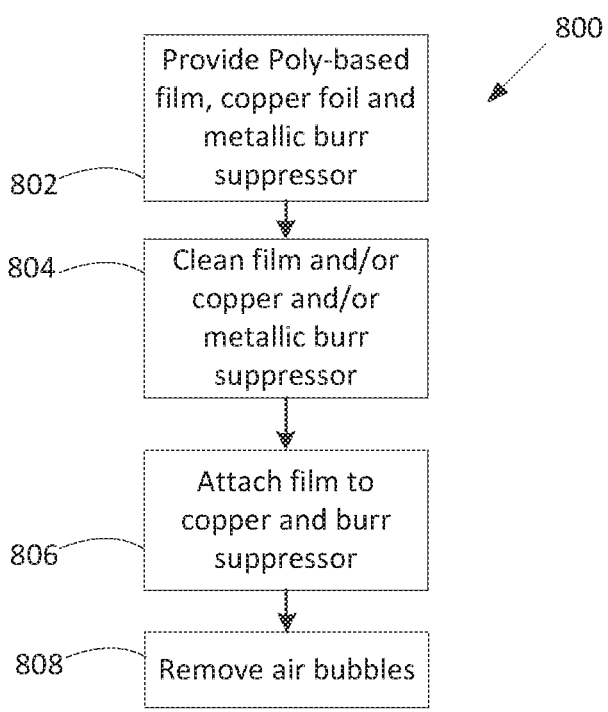
FIG. 8 is a flowchart of an example method of manufacturing a burr suppressing copper foil.

Reference will now be made to FIG. 8, which illustrates a flowchart of a method 800 for manufacturing a burr-suppressing copper foil 100 of the type described above with reference to FIGS. 1 to 2. The method 800 may be performed in a clean room environment.

At operation 802, the method 800 includes providing a copper foil 102 of the type described with reference to FIGS. 1 and 2, a metallic burr suppressor of the type described with reference to FIGS. 1 and 2, and a poly-based film 106 of the type described with reference to FIGS. 1 and 2. The poly-based film has an adhesive of the type described with reference to FIGS. 1 and 2 applied to opposing sides of the poly-based film (i.e, it has a double-sided adhesive coating).

In at least some embodiments, at operation 804, the poly-based film 106 and/or the copper foil 102 and/or the metallic burr suppressor 103 are cleaned. Such cleaning may be performed by passing the material over one or more adhesive take-up rollers that have a tack for removing debris. These take-up rollers may be, for example, silicone rollers.

At operation 806, the copper foil 102 is attached to the poly-based film at a first side of the poly-based film using the adhesive applied to the surface of the poly-based film. For example, the copper foil 102 and the poly-based film 106 may be pressed into contact. The poly-based film may be held taut during the attaching.

At operation 806, the metallic burr suppressor 103 is attached to the poly-based film at a second side of the poly-based film using the adhesive applied to the surface of the poly-based film. For example, the metallic burr suppressor 103 and the poly-based film 106 may be pressed into contact. The poly-based film may be held taut during the attaching.

In at least some embodiments, the attaching of the copper foil 102 to the poly-based film 106 and the attaching of the metallic burr suppressor 103 to the poly-based film are performed concurrently.

At operation 808, the copper foil and the poly-based film may be processed to remove any air bubbles between these layers. For example, in some embodiments, the copper foil and the poly-based film are squeezed together by the roller to roll out any air bubbles. Similarly, the air bubbles between the metallic burr suppressor 103 and the poly-based film may also be removed. When a machine of the type described above with reference to FIG. 7 is used, the removal of the air bubbles between all three of these layers is performed concurrently.

While the discussion above generally described an embodiment in which a poly-based film acts as an intermediary to connect a metallic burr suppressor to a copper foil, in other embodiments, the poly-based film may not be used and, instead, the metallic burr suppressor of the type described above may be attached directly to a copper foil of the type described above with an adhesive of the type described above. In such embodiments, the adhesive may be permanently attached to the metallic burr suppressor and removably attached to the copper foil.

The various embodiments presented above are merely examples. Variations of the innovations described herein will be apparent to persons of ordinary skill in the art, such variations being within the intended scope of the present application. In particular, features from one or more of the above-described example embodiments may be selected to create alternative example embodiments including a sub-combination of features which may not be explicitly described above. In addition, features from one or more of the above-described example embodiments may be selected and combined to create alternative example embodiments including a combination of features which may not be explicitly described above. Features suitable for such combinations and sub-combinations would be readily apparent to persons skilled in the art upon review of the present application as a whole. The subject matter described herein and in the recited claims intends to cover and embrace all suitable changes in technology.

What is claimed is:

1. A method for manufacturing a printed circuit board (PCB), the method comprising:
constructing a book having a burr-suppressing copper foil on at least one exterior side of the book, the burr-suppressing copper foil comprising a poly-based film having an adhesive applied at opposing sides, a copper foil directly contacting and coupled to the poly-based film with the adhesive on a first side of the poly-based film, the copper foil adjacent to and in contact with a pre-impregnated layer, and a metallic burr suppressor coupled to the poly-based film with the adhesive on a second side of the poly-based film, the metallic burr suppressor being an outer layer of the book;

applying a lamination cycle to the book using a laminating press to cure the pre-impregnated layer of the book and form a laminated book;

after the lamination cycle, drilling the laminated book; and removing the poly-based film and the metallic burr suppressor from the drilled and laminated book.

2. The method of claim 1, wherein the metallic burr suppressor is an aluminum panel and wherein, during the drilling, the aluminum panel forms an entry side of the laminated book for a drill bit.

3. The method of claim 1, wherein the metallic burr suppressor is constructed of copper and wherein, during drilling, the copper metallic burr suppressor forms an exit side of the laminated book for a drill bit.

4. The method of claim 1, wherein the metallic burr suppressor is constructed of a non-ferrous metal and wherein, during drilling, the non-ferrous metallic burr suppressor forms an exit side of the laminated book for a drill bit.

5. The method of claim 1, wherein the poly-based film is a polyethylene terephthalate film.

6. The method of claim 1, wherein the adhesive between the copper foil and the poly-based film is a low-tack adhesive that allows the copper foil to be easily removed from the poly-based film and the adhesive therebetween.

7. The method of claim 6, wherein the adhesive has a tack strength less than or equal to 6 grams per 25 millimeter width.

8. The method of claim 6, wherein the adhesive is permanently applied to the poly-based film.

9. The method of claim 1, wherein the adhesive is non-silicone based.

10. The method of claim 1, wherein the adhesive is an acrylic adhesive.

11. The method of claim 1 wherein the poly-based film is one that does not deteriorate under heating at temperatures of one hundred and eighty degrees Celsius.

12. The method of claim 1, wherein the adhesive is uniform across a surface of the poly-based film.

13. The method of claim 1, further comprising removing the metallic burr suppressor from the poly-based film.

14. The method of claim 13, further comprising recycling the metallic burr suppressor.

15. The method of claim 1, wherein the book includes a first burr-suppressing copper foil and a second burr-suppressing copper foil, the first burr-suppressing copper foil having a copper metallic burr suppressor and the second burr-suppressing copper foil having an aluminum metallic burr suppressor and wherein, during drilling, the copper metallic burr suppressor forms an exit side of the laminated book for a drill bit and the aluminum metallic burr suppressor forms an entry side of the laminated book for the drill bit.

* * * * *